United States Patent
Lei et al.

(10) Patent No.: US 9,105,710 B2
(45) Date of Patent: Aug. 11, 2015

(54) WAFER DICING METHOD FOR IMPROVING DIE PACKAGING QUALITY

(71) Applicant: APPLIED MATERIALS, INC., Santa Clara, CA (US)

(72) Inventors: Wei-Sheng Lei, San Jose, CA (US); Brad Eaton, Menlo Park, CA (US); Aparna Iyer, Sunnyvale, CA (US); Madhava Rao Yalamanchili, Morgan Hill, CA (US); Ajay Kumar, Cupertino, CA (US); Jungrae Park, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

(21) Appl. No.: 14/091,014

(22) Filed: Nov. 26, 2013

(65) Prior Publication Data

US 2015/0064878 A1 Mar. 5, 2015

Related U.S. Application Data

(60) Provisional application No. 61/872,315, filed on Aug. 30, 2013.

(51) Int. Cl.
*H01L 21/00* (2006.01)
*H01L 21/78* (2006.01)
(Continued)

(52) U.S. Cl.
CPC .............. *H01L 21/78* (2013.01); *B23K 26/367* (2013.01); *H01L 21/308* (2013.01); *H01L 21/3065* (2013.01); *H01L 21/67069* (2013.01)

(58) Field of Classification Search
CPC .................. H01L 21/02345; H01L 21/02354; H01L 21/02664; H01L 21/02675; H01L 21/3065

USPC .................................................. 438/460, 462
See application file for complete search history.

(56) References Cited

U.S. PATENT DOCUMENTS 4,049,944 A  9/1977 Garvin et al.
4,339,528 A  7/1982 Goldman
(Continued)

FOREIGN PATENT DOCUMENTS

JP  9216085  8/1997
JP  10321908  12/1998
(Continued)

OTHER PUBLICATIONS

Linder, V. et al., "Water-Soluble Sacrificial Layers for Surface Micromachining", www.small-journal.com, 2005, 1, No. 7, 7 pgs.
(Continued)

*Primary Examiner* — Bradley K Smith
(74) *Attorney, Agent, or Firm* — Blakely, Sokoloff, Taylor & Zafman (57) ABSTRACT

In embodiments, a hybrid wafer or substrate dicing process involving an initial laser scribe and subsequent plasma etch is implemented for die singulation while also removing an oxidation layer from metal bumps on the wafer. In one embodiment, a method includes forming a mask over the semiconductor wafer covering the plurality of ICs, the plurality of ICs including metal bumps or pads with an oxidation layer. The method includes patterning the mask with a laser scribing process to provide a patterned mask with gaps, exposing regions of the semiconductor wafer between the ICs. The method includes plasma etching the semiconductor wafer through the gaps in the patterned mask to singulate the plurality of ICs and remove the oxidation layer from the metal bumps or pads.

20 Claims, 9 Drawing Sheets

(51) Int. Cl.
  *H01L 21/3065* (2006.01)
  *H01L 21/308* (2006.01)
  *H01L 21/67* (2006.01)
  *B23K 26/36* (2014.01)

(56) References Cited

U.S. PATENT DOCUMENTS

| | | |
|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 * | 12/2009 | Haji et al. ............ 438/460 |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,883,615 B1 * | 11/2014 | Holden et al. ............ 438/462 |
| 2003/0162313 A1 | 8/2003 | Kim et al. |
| 2004/0080045 A1 | 4/2004 | Kimura et al. |
| 2004/0121563 A1 | 6/2004 | Farnworth et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2012/0322241 A1 | 12/2012 | Holden et al. |
| 2012/0322242 A1 * | 12/2012 | Lei et al. ............ 438/462 |
| 2013/0045554 A1 | 2/2013 | Yamazaki |
| 2013/0065378 A1 | 3/2013 | Johnson et al. |
| 2013/0224910 A1 | 8/2013 | Shi et al. |
| 2013/0230972 A1 | 9/2013 | Johnson et al. |

FOREIGN PATENT DOCUMENTS

| | | |
|---|---|---|
| JP | 2001144126 | 2/2001 |
| JP | 2001127011 | 5/2001 |
| JP | 2003179005 | 6/2003 |
| JP | 2004031526 | 1/2004 |
| JP | 2004055684 | 2/2004 |
| JP | 2010-287592 | 12/2010 |
| KR | 10-2009-0130701 | 12/2009 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

"International Search Report and Written Opinion of the International Searching Authority dated Nov. 27, 2014, in International Patent Application No. PCT/US2014/051523, 9 pages".

* cited by examiner

WAFER DICING METHOD FOR IMPROVING DIE PACKAGING QUALITY

PRIORITY

This application is a Non-Provisional of, claims priority to, and incorporates by reference in its entirety for all purposes, the U.S. Provisional Patent Application No. 61/872,315 filed Aug. 30, 2013.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies. Each die may have metal bumps and/or pads for electrical coupling to other dies or boards (e.g., printed circuit boards (PCBs)). Typically, a "bump" refers to a soldering point on a front side of a device, and a "pad" refers to a soldering point on a back side of a device. In three dimensional (3D) packaging, the bumps on one die may be solder-bonded to the pads on another die. For example, the bumps of a die are bonded to pads of a PCB.

Metal alloys such as Tin alloys (e.g., SnAg) are widely used for metal bumps and pads in die packaging applications. The surface condition of these bumps or pads can directly affect bonding processes such as thermal compression bonding. One typical issue is that during bump and pad formation and subsequent processes prior to bonding, the bumps and pads may become easily oxidized. The oxidization layer can adversely affect the bonding process. Typically, flux is used to remove the oxidization layer on the bumps and pads, however, processes using flux typically require the application of heat onto the bumps to facilitate the oxidization layer removal. Too much heat can negatively affect die quality, particularly in 3D packaging applications where multiple dies are stacked together. The accumulated heat input can weaken the dies both electronically and mechanically. Other methods for bump or pad cleaning have been explored, but have drawbacks including high cost, and the risk of subsequent oxidation after cleaning.

Furthermore, using a soldering flux to remove an oxidation layer from the bumps and pads prior to bonding can result in a flux residue left on the bumps and pads. Cleaning the flux residue is difficult, especially in dies including dense through-silicon vias. Because of the difficulties involved in removing flux residue, existing manufacturing methods leave the flux residue on the ICs, resulting in erosion of the metal bumps or pads over time, which can reduce the long term reliability of the packages.

SUMMARY

One or more embodiments of the invention are directed to methods of dicing semiconductor wafers, each wafer having a plurality of integrated circuits (ICs) thereon.

According to one embodiment, a method of dicing a semiconductor wafer including a plurality of ICs involves forming a mask over the semiconductor wafer covering the plurality of ICs, the plurality of ICs including metal bumps or pads with an oxidation layer. The method includes patterning the mask with a laser scribing process to provide a patterned mask with gaps, exposing regions of the semiconductor wafer between the ICs. The method also includes plasma etching the semiconductor wafer through the gaps in the patterned mask to singulate the plurality of ICs and remove the oxidation layer from the metal bumps or pads.

In one embodiment, a method of dicing a substrate including a plurality of ICs involves patterning, with a laser scribe process, a mask disposed above the substrate to form a trench exposing regions of the substrate between the ICs. The mask is thicker over a dicing street than over metal bumps or pads of the ICs. The method further involves plasma etching the substrate in the exposed regions to singulate the plurality of ICs and remove an oxidation layer from the metal bumps or pads.

In one embodiment, a system for dicing a substrate including a plurality of ICs includes a deposition module to apply a mask over the substrate covering the plurality of ICs, the plurality of ICs having metal bumps or pads with an oxidation layer. The system includes a laser scribe module to pattern the mask to form a trench exposing regions of a substrate between the ICs. The system also includes a plasma etch module physically coupled to the laser scribe module to etch the substrate in the exposed regions to singulate the plurality of ICs and remove the oxidation layer from the metal bumps or pads.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Methods of dicing semiconductor wafers, each wafer having a plurality of integrated circuits (ICs) thereon, are described. In the following description, numerous specific details are set forth, such as laser and plasma etch wafer dicing approaches, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

In embodiments, a hybrid wafer or substrate dicing process involves an initial laser scribe, and subsequent plasma etch to simultaneously singulate the dies and remove an oxidation layer from metal bumps or pads on the dies. The method involves applying a mask layer over the wafer or substrate, which includes a thin layer over the metal bumps or pads. The laser scribe process may be used to cleanly remove a mask layer, organic and inorganic dielectric layers, and device layers in a dicing street. The laser etch process may be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. The plasma etching process also etches the thin mask layer over the metal bumps or pads, and removes an oxidation layer from the metal bumps or pads. Thus, embodiments of the invention remove the oxidation layer from the metal bumps or pads to enable fluxless soldering.

As noted above, embodiments of the invention clean the metal bumps or pads at the die singulation step, which is typically the last phase of wafer level processing and the beginning of die packaging. After die singulation, the chances for metal bump and pad oxidization is minimized. Achieving dicing and bump cleaning in a single step reduces costs due to eliminating the need for an additional processing step. Costs can also be reduced due to the application of a thinner mask layer, which reduces consumption of mask materials. Additionally, for a given mask material, a thinner mask layer aids in the formation of a more precise mask and wafer device layer opening profile during laser scribing, which can lead to better trench sidewall quality (i.e., smoother trench walls) during plasma dicing. Furthermore, achieving smoother trench sidewalls can reduce or eliminate the etch time used for sidewall smoothening efforts, which translates into higher etching throughput and etchants savings. Embodiments employing the thin mask can also reduce laser power requirements and improve laser scribing throughput.

Figure 1:
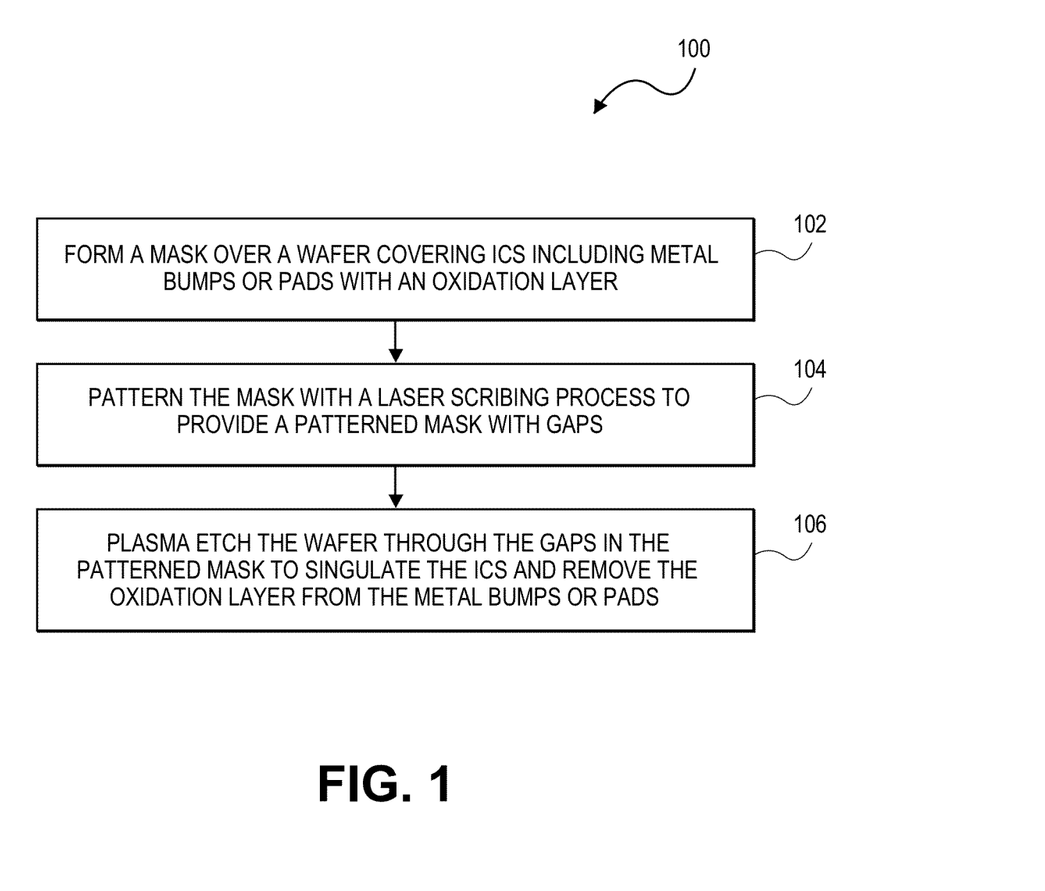
FIG. 1 is a flowchart representing operations in a method of dicing a semiconductor wafer and cleaning metal bumps or pads, the semiconductor wafer including a plurality of integrated circuits, in accordance with an embodiment of the present invention.
Figure 2A:
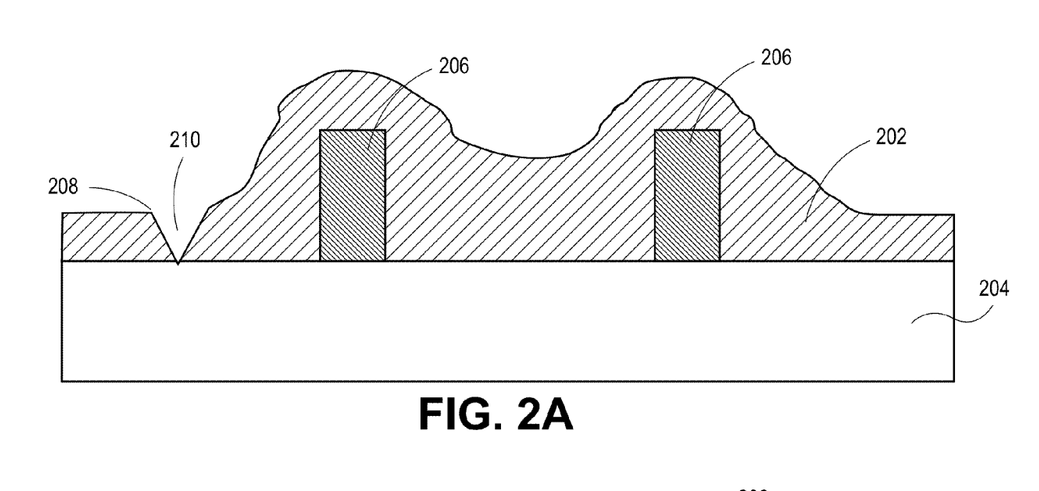
FIGS. 2A and 2B illustrate cross-sectional views of a semiconductor wafer including a plurality of integrated circuits during performance of a method of dicing the semiconductor wafer corresponding to operations of FIG. 1, but with a thick mask application instead of the thin mask application described in FIG. 1.
Figure 2B:
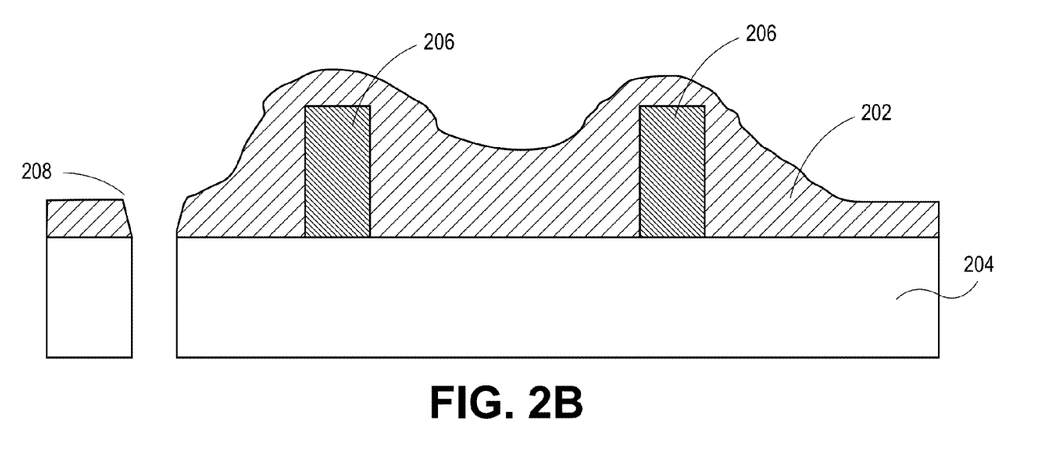
Figure 4A:
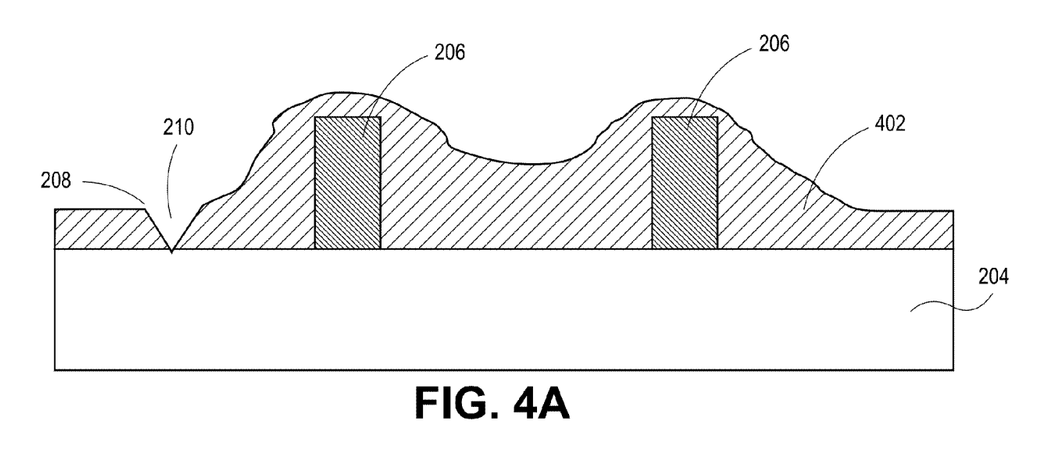
FIGS. 4A and 4B illustrate cross-sectional views of a semiconductor wafer including a plurality of integrated circuits during performance of a method of dicing the semiconductor wafer with a thin mask, corresponding to operations of FIG. 1, in accordance with embodiments of the present invention.
Figure 4B:
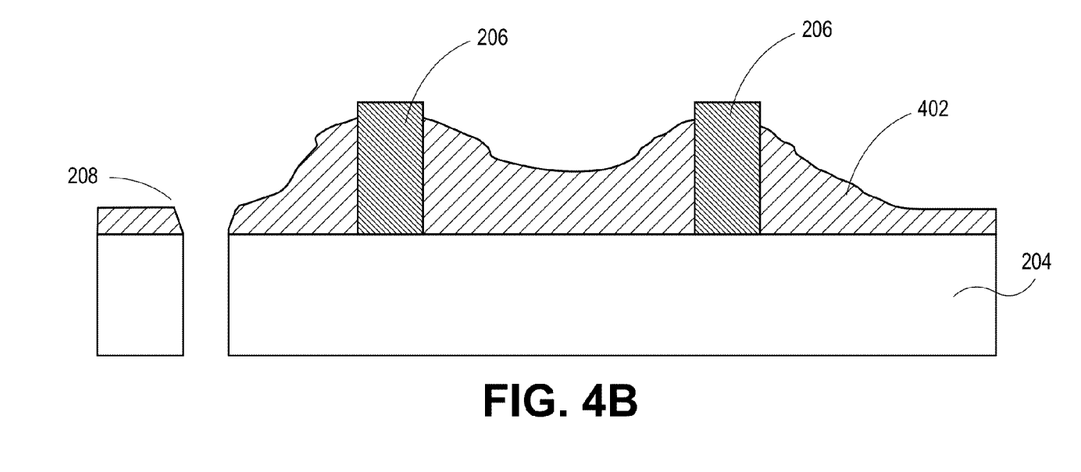

FIG. 1 illustrates operations in a method of dicing a semiconductor wafer including a plurality of integrated circuits, in accordance with an embodiment of the present invention. FIGS. 2A and 2B illustrate cross-sectional views of a semiconductor wafer including a plurality of integrated circuits during performance of the method of FIG. 1, but with a thick mask application instead of the thin mask application described in FIG. 1. FIGS. 4A and 4B also illustrate cross-sectional views of a semiconductor wafer including a plurality of integrated circuits during performance of the method of FIG. 1, but with a thin mask application, in accordance with embodiments of the present invention.

During the first operation 102 of the method 100 in FIG. 1, and corresponding to FIG. 2A and FIG. 4A, a front side mask 202, 402 is formed above a semiconductor wafer or substrate 204. According to one embodiment, the semiconductor wafer or substrate 204 has a diameter of at least 300 mm and has a thickness of 300 µm to 800 µm. In one embodiment, the semiconductor substrate 204 has a thickness of 10 µm to 800 µm. In one embodiment, the semiconductor substrate 204 has a thickness of less than 75 µm (e.g., 10 µm to 75 µm). In an embodiment, the mask 202, 402 is a conformal mask that conforms to a shape or topography of the underlying patterns on the wafer, resulting in a mask thickness which is essentially the same in the dicing streets 208 and over the metal bumps or pads 206. In alternative embodiments, however, the mask is non-conformal. Non-conformal masks are thinner over bumps or pads than over valleys, and may be substantially thicker in the dicing street 208 than on top of bumps or pads 206. The masks 202, 402 illustrated in FIGS. 2A, 2B, 4A, and 4B are non-conformal masks. Formation of the masks 202, 402 may be by chemical vapor deposition (CVD), spin coating, spray coating, dry film sheet vacuum laminating, or by any other process known in the art. CVD and dry film vacuum laminating typically achieve more conformal masks while spin coating and spray coating tend to result in less-conformal masks.

In one embodiment, the mask 202, 402 covers and protects integrated circuits (ICs) (not shown) formed on the surface of semiconductor wafer and also covers metal bumps or pads 206 projecting or protruding up from the surface of the semiconductor wafer 204. Metal bumps or pads 206 may be 10-50 µm high according to some embodiments. The mask 202 also covers intervening streets 208 formed between adjacent ones of the integrated circuits.

Existing methods typically seek to form a mask over the metal bumps or pads that is thick enough to survive the duration of the plasma etching process and protect the bumps or pads from etching. For example, FIGS. 2A and 2B illustrate wafers coated with a thick mask 202. To etch 50 µm of the silicon while protecting the bumps or pads 206 throughout the etching process, a method might involve applying a 5 µm mask on top of the bumps or pads 206 prior to plasma etching. In one such example with metal bumps or pads, the method may involve applying a mask of ~25 µm to the dicing streets to achieve a mask of ~5 µm on top of the 35 µm high bumps or pads. In this example the bumps or pads are protected from plasma etching during the plasma etching process. In one such example, to achieve protection of the bumps or pads, an unnecessarily thick mask layer is applied to the valleys of the wafer.

In contrast, in one embodiment, a method involves applying a thinner mask over the semiconductor wafer, resulting in a thin mask layer on top of the metal bumps or pads to intentionally expose the metal bumps or pads during the plasma etching process. For example, FIGS. 4A and 4B illustrate a semiconductor wafer or substrate 204 coated with a thin mask 402. In one embodiment, the method involves applying a mask such that the mask layer 402 over the metal bumps or pads 206 is 1-2 µm, causing the metal bumps or pads 206 to be exposed towards the end of the plasma etching process. In another embodiment, the method involves applying a mask layer 402 with a thickness of 1-5 μm over the metal bumps or pads 206. The thickness of the mask 402 applied may depend on the bump or pad height. For example, according to embodiments, the method involves applying the mask 402 having a thickness of ~1 μm over the tops of the bumps or pads 206 having a height of 35 μm or less. In another example, the method involves applying the mask 402 having a thickness of ~5 μm over the tops of bumps or pads 206 having a height of 50 μm. As is discussed more below, exposure of the metal bumps or pads to plasma etching results in an oxidation layer being removed from the metal bumps or pads during a dicing operation. Other thicknesses of masks may be thin enough to expose the metal bumps or pads during plasma processing, and depend on the plasma processing parameters and mask composition.

In accordance with an embodiment of the present invention, forming the mask 402 includes forming a layer such as, but not limited to, a water-soluble layer (PVA, etc.), and/or a photo-resist layer, and/or an I-line patterning layer. For example, a polymer layer such as a photo-resist layer may be composed of a material otherwise suitable for use in a lithographic process. In embodiments with multiple mask layers, a water-soluble base coat may be disposed below a non-water-soluble overcoat. The base coat then provides a means of stripping the overcoat while the overcoat provides plasma etch resistance and/or for good mask ablation by the laser scribing process. It has been found for example, that mask materials transparent to the laser wavelength employed in the scribing process contribute to low die edge strength. Hence, a water-soluble base coat, of PVA, for example, as the first mask material layer, may function as a means of undercutting a plasma-resistant/laser energy absorbing overcoat layer of the mask so that the entire mask may be removed/lifted off from the underlying integrated circuit (IC) thin film layer. The water-soluble base coat may further serve as a barrier protecting the IC thin film layer from the process used to strip the energy absorbing mask layer. In embodiments, the laser energy absorbing mask layer is UV-curable and/or UV absorbing, and/or green-band (500-540 nm) absorbing. Exemplary materials include many photo-resists and polyimide (PI) materials conventionally employed for passivation layers of IC chips. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

Figure 6:
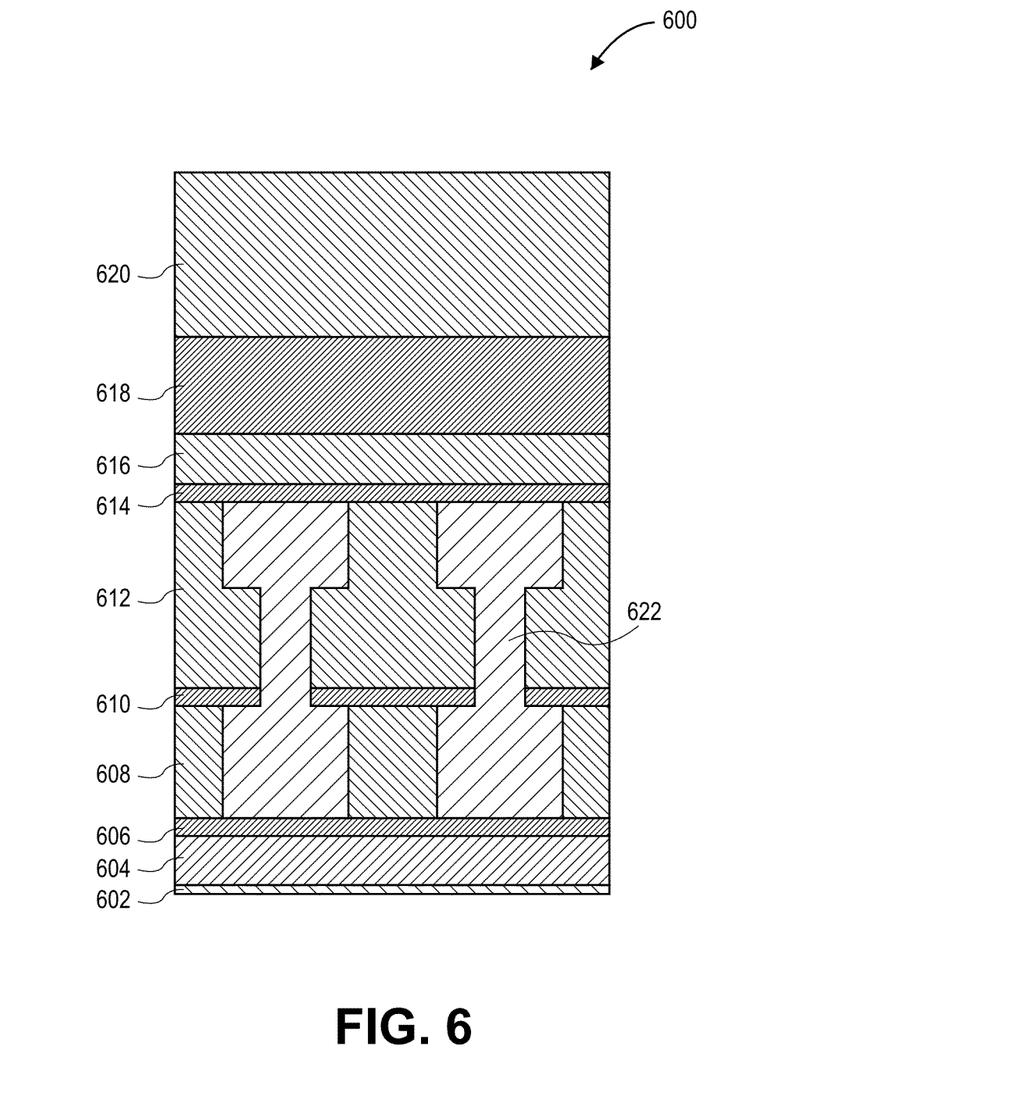
FIG. 6 illustrates a cross-sectional view of a stack of materials that may be present in a street region of a semiconductor wafer or substrate, in accordance with embodiments of the present invention.

Referring again to FIGS. 2A, 2B, 4A, and 4B, the semiconductor wafer or substrate 204 has disposed thereon or therein, an array of semiconductor devices and metal bumps or pads 206. Examples of such semiconductor devices include, but are not limited to, memory devices or complementary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps/pads and passivation layers may be formed above the interconnect layers. Materials making up the streets may be similar to or the same as those materials used to form the integrated circuits. For example, streets may be composed of layers of dielectric materials, semiconductor materials, and metallization. In one embodiment, one or more of the streets includes test devices similar to the actual devices of the integrated circuits. FIG. 6, which is described below in more detail, illustrates an example of a stack of materials making up a dicing street.

Returning to FIG. 1, and turning to corresponding FIGS. 2A and 4A, the method 100 proceeds with bulk target layer material removal at operation 104. To minimize dielectric delamination and cracking, a femtosecond laser is preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

The laser scribing process is performed generally to remove the material of the streets present between the integrated circuits. In accordance with an embodiment of the present invention, patterning the mask with the laser scribing process includes forming trenches 210 partially into the regions of the semiconductor wafer between the integrated circuits. In an embodiment, patterning the mask 202, 402 with the laser scribing process includes direct writing a pattern using a laser having a pulse width in the femtosecond range.

Specifically, a laser with a wavelength in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, 402, the streets 208 and, possibly, a portion of the semiconductor wafer or substrate 204.

Laser parameters selection, such as pulse width, may be critical to developing a successful laser scribing and dicing process that minimizes chipping, microcracks, and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

As mentioned above, a street 208 between individual integrated circuits disposed on a wafer or substrate 204 may include the similar or same layers as the integrated circuits themselves. For example, FIG. 6 illustrates a cross-sectional view of a stack of materials that may be used in a street region of a semiconductor wafer or substrate, in accordance with an embodiment of the present invention. Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, a second silicon dioxide layer 618, and a layer of photo-resist 620 or some other mask. Copper metallization 622 is disposed between the first and third etch stop layers 606 and 614 and through the second etch stop layer 610. In a specific embodiment, the first, second and third etch stop layers 606, 610 and 614 are composed of silicon nitride, while low K dielectric layers 608 and 612 are composed of a carbon-doped silicon oxide material.

Under conventional laser irradiation (such as nanosecond-based or picosecond-based laser irradiation), the materials of street 600 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In one embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 500 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to or in the UV range provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 500 femtoseconds of the laser having the wavelength of approximately less than or equal to 540 nanometers are used. However, in an alternative embodiment, dual laser wavelengths (e.g., a combination of an IR laser and a UV laser) are used.

Returning to FIG. 1, and turning to corresponding FIGS. 2B and 4B, the semiconductor wafer or substrate 204 is next plasma etched at operation 106. According to an embodiment, plasma etching the semiconductor wafer or substrate 204 both singulates the ICs and removes an oxidation layer from the metal bumps or pads 206 when a thin mask layer 402 is applied to the metal bumps or pads 206 as illustrated in FIG. 4B. However, as can be seen in FIG. 2B, when a thick mask 202 is deposited, the tops of the metal bumps or pads 206 are still protected by the mask 202 throughout the duration of the etching process.

As illustrated in FIGS. 2B and 4B, the plasma etch front proceeds through the gaps in the patterned mask 202. As illustrated, in embodiments a trench with a smooth sidewall is achieved due in part to the thinner mask application, which can result in a more precise device layer opening profile from the laser scribing process. However, other embodiments may include plasma etching procedures which result in scalloped sidewalls. In such an embodiment, further sidewall smoothing processing may be employed.

In the embodiments illustrated in FIGS. 2B and 4B, the semiconductor wafer or substrate 204 is etched through to complete singulation of the dies, however, other embodiments may involve plasma etching only partially through the semiconductor wafer or substrate 204 (e.g., etching the trenches 210 formed with the laser scribing process so as to not etch entirely through semiconductor wafer or substrate 204) and completing the dicing of the wafer with other processing such as backside grinding.

In one embodiment, plasma etching to singulate the dies involves a Bosch process which includes iterations of three operations, including: deposition (e.g., of Teflon or other polymer), anisotropic etching the semiconductor wafer or substrate 204 through gaps in the patterned mask 202, 402 to advance an etched trench 210, and isotropically etching the anisotropically etched trench. The polymer deposition protects the trench sidewall. The anisotropic etch removes the polymer from the horizontal surface and etches into the silicon depth-wise. The isotropic etch etches the silicon on the bottom and side of the trench, and generates a trench sidewall with a vertical taper (e.g., approximately 90 degree sidewall).

In one such embodiment employing both an anisotropic etch and an isotropic etch, one or both of the etching operations removes the oxidation layer from the surface of the bumps or pads 206. In a specific embodiment, during the etch process, the etch rate of the material of the silicon of the semiconductor wafer 204 is greater than 25 per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used. In an exemplary embodiment, a deep silicon etch is used to etch a single crystalline silicon substrate or semiconductor wafer 204 at an etch rate greater than approximately 40% of conventional silicon etch rates (e.g., 40 μm per minute, or more) while maintaining essentially precise profile control and virtually scallop-free sidewalls. In a specific embodiment, a through-silicon via type etch process is used. The etch process is based on a plasma generated from a reactive gas, which may include a fluorine-based gas such as $SF_6$, $C_4F_6$, $C_4F_8$, $CF_4$, $CHF_3$, $XeF_2$, or any other reactant gas capable of etching silicon at a relatively fast etch rate.

To summarize FIGS. 1, 2A, 2B, 4A, and 4B, the die singulation process may include applying a mask layer, laser scribing to form a trench in the mask layer, passivation layer, and device layers as to cleanly expose silicon substrate, followed by plasma etching to dice through silicon substrate. When a thin mask layer is applied to the bumps as in FIGS. 4A and 4B, the plasma etching that singulates the dies also simultaneously removes an oxidation layer from exposed metal bumps or pads. Thus, the metal bumps or pads are cleaned without relying on flux, and without an additional plasma processing step.

After plasma etching, the method may include additional operations such as wafer cleaning, die pick, and soldering. Soldering may include soldering with or without flux.

In an embodiment where soldering employs flux, the method may include cleaning (e.g., plasma $O_2$ cleaning) of the die sidewall and/or surface to remove residues remaining from plasma etching such as Fluorine prior to soldering. Soldering with flux may be done according to processes known in the art, such as by reflow soldering in which a combination of solder, flux, and heat is applied to the metal bumps or pads of two ICs or boards to be electrically joined. Embodiments employing soldering with flux may include an additional operation of cleaning the flux residue from the IC and/or applying an underfill (e.g., an epoxy or other suitable underfill material).

As explained above, embodiments of the invention also enable fluxless soldering. Such a method may involve an initial wafer cleaning operation and die picking operation, followed by fluxless soldering.

Fluxless soldering can include placing, pressing (e.g., applying pressure), and clamping two dies (or a die to a board, wafer, etc.) together with front sides facing each other, which is often known as thermal compression bonding. When the dies are positioned or aligned so that their front sides face each other, bumps or pads on each die have mechanical contact with counterparts on the other die. A method of fluxless soldering then applies heat to the clamped dies by, for example, placing the clamped dies into a microwave oven. In one such embodiment, the microwave oven is preheated to 175° C., and the clamped dies are left in the oven for 2-5 minutes. Other embodiments may use other methods of applying heat. The method next includes unloading the clamped dies from the oven, and removing the clamp.

According to embodiments, the die side wall bears some byproducts from dicing and/or fluxless soldering. For example, in one embodiment, the die sidewall has fluorine post dicing (e.g., after plasma etching the wafer to singulate the dies). Removing the fluorine can enable effective underfill wetting (e.g., epoxy/polymer wetting) on the die surface and epoxy encapsulation of dies.

Thus, fluxless soldering may be used to electrically connect dies having bumps or pads without oxidized surfaces, in accordance with embodiments herein.

Figure 3A:
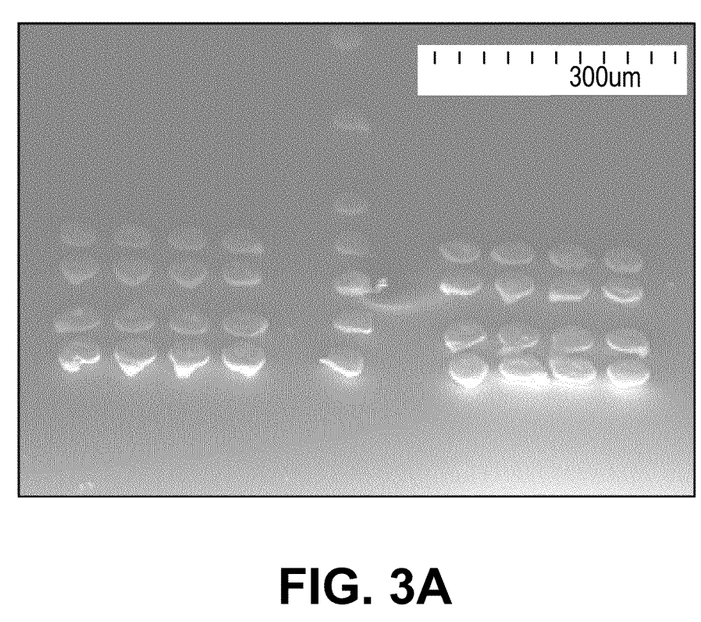
FIGS. 3A and 3B are images of dies having bumps which were coated with a thick mask and plasma etched as in FIGS. 2A and 2B, and clamped together for fluxless soldering.
Figure 3B:
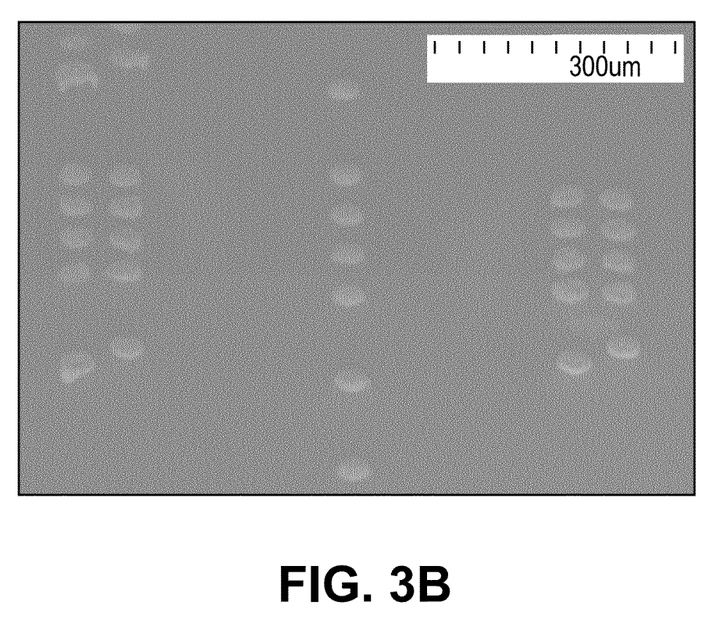
Figure 5A:
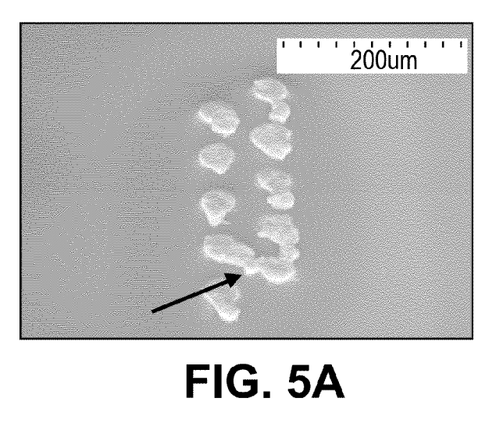
FIGS. 5A, 5B, 5C, 5D, 5E, 5F, and 5G are images of dies having bumps that were coated with a thin mask and plasma etched as in FIGS. 4A and 4B, and clamped together for fluxless soldering.
Figure 5B:
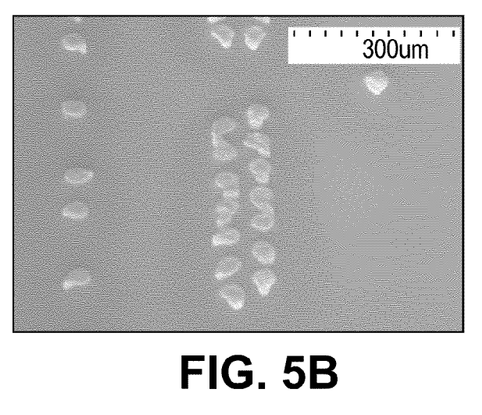
Figure 5C:
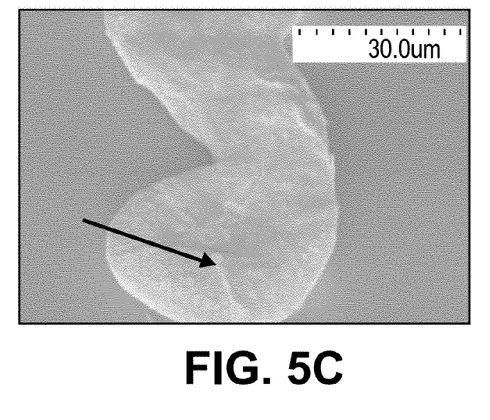
Figure 5D:
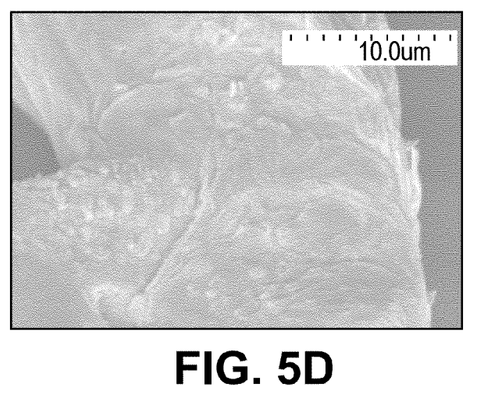
Figure 5E:
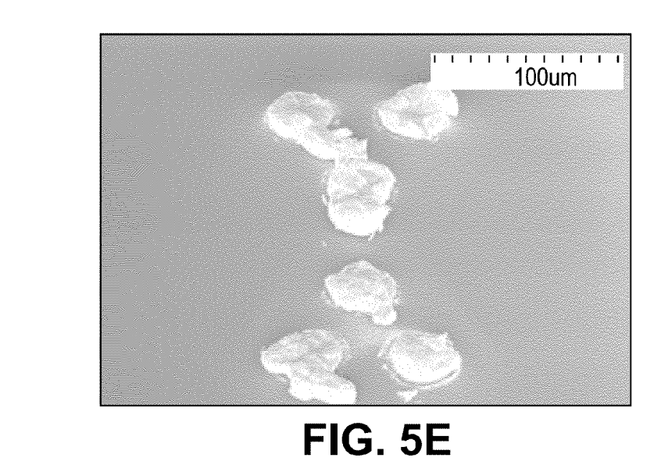
Figure 5F:
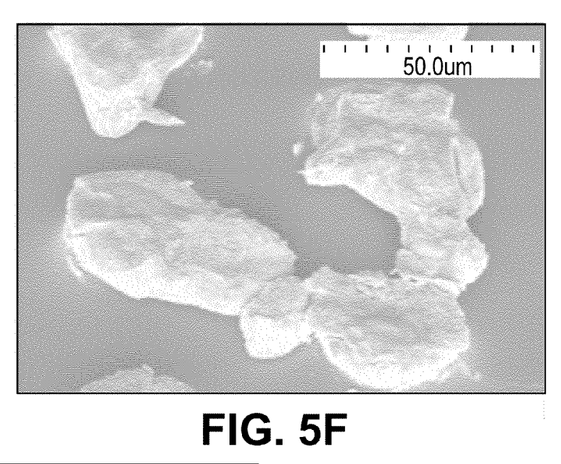
Figure 5G:
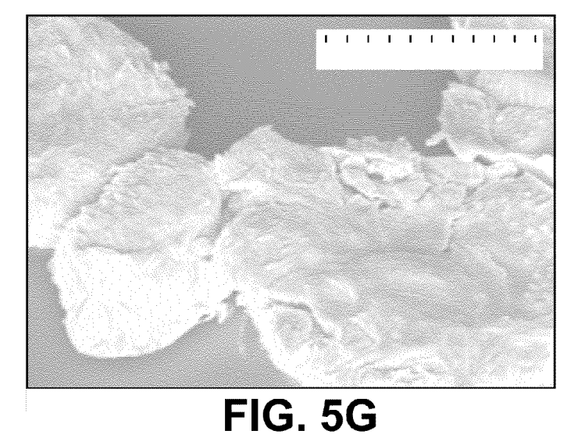

FIGS. 3A, 3B, 5A, 5B, 5C, 5E, 5F, and 5G illustrate the results of such a fluxless soldering process on dies that were coated with either thick or thin masks. FIGS. 3A and 3B are images of bumps that were coated with a thick mask prior to plasma etching, and then subject to a fluxless soldering process. FIGS. 5A and 5B are images of bumps that were coated with a thin mask prior to plasma etching, and then subject to a fluxless soldering process. FIGS. 5C, 5D, 5E, 5F, and 5G are magnified images of bumps that were coated with a thin mask prior to plasma etching, and then subject to a fluxless soldering process.

As explained above with reference to FIGS. 2A and 2B, bumps coated with a thick mask, such as the bumps in FIGS. 3A and 3B, were not exposed to plasma during the dicing process. As a result, bumps on each die deformed, but did not reflow well. Thus, the bumps that were not exposed during the plasma etching process did not bond to each other.

In contrast, bumps coated with a thin mask prior to plasma etching are exposed during the plasma etching process, enabling fluxless soldering as illustrated in FIGS. 5A-5G. As can be seen in FIGS. 5A-5G, bumps on each die reflowed well and were able to bond together without relying on flux. Thus, embodiments as described herein in which a plasma etching operation to singulate a wafer also remove an oxidation layer from the bumps enables fluxless soldering. As described above, soldering without flux to bond metal bumps or pads has the advantage of eliminating flux residue leftover from soldering with flux, resulting in ICs without improved long-term reliability.

Figure 7:
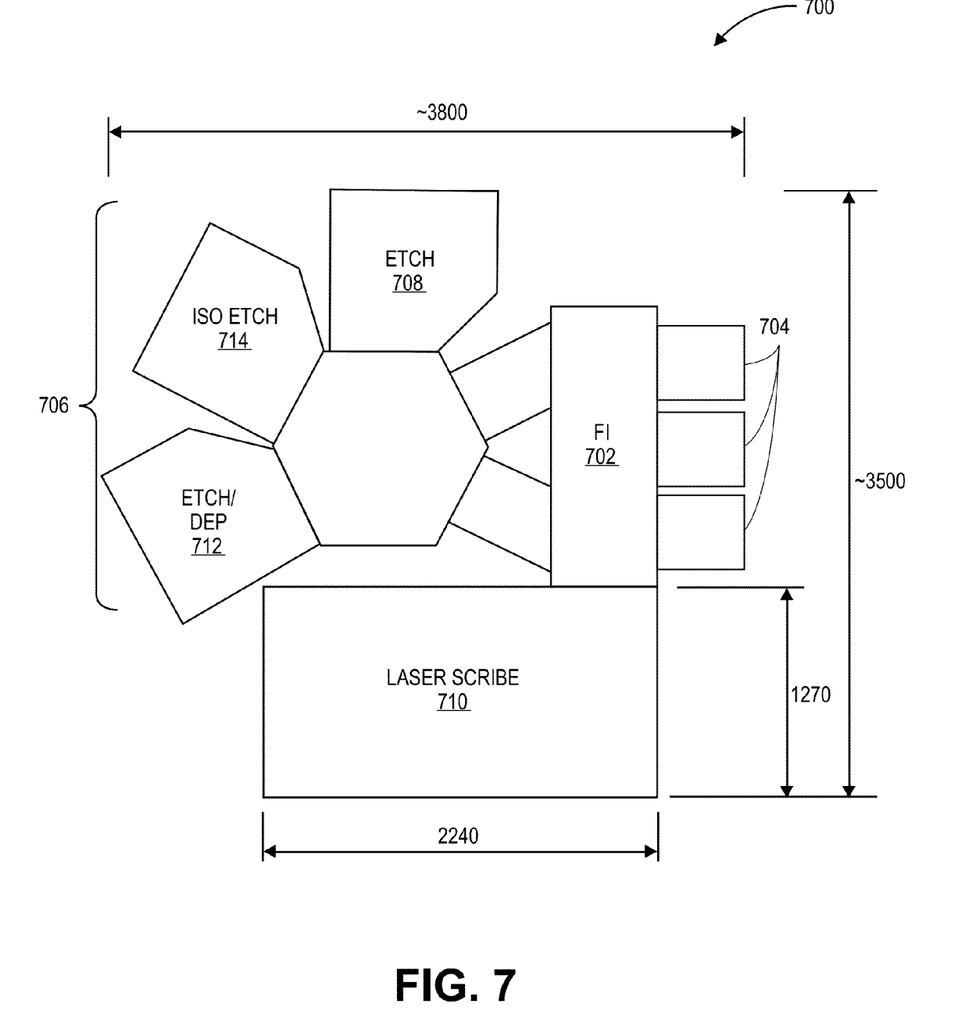
FIG. 7 illustrates a plan view schematic of an integrated dicing system in accordance with an embodiment of the present invention.

Referring to FIG. 7, a process tool 700 includes a factory interface 702 (FI) having a plurality of load locks 704 coupled therewith. A cluster tool 706 is coupled with the factory interface 702. The cluster tool 706 includes one or more plasma etch chambers, such as anisotropic plasma etch chamber 708 and isotropic plasma etch chamber 714. A laser scribe apparatus 710 is also coupled to the factory interface 702. The overall footprint of the process tool 700 may be, in one embodiment, approximately 3500 millimeters (3.5 meters) by approximately 3800 millimeters (3.8 meters), as depicted in FIG. 7.

In an embodiment, the laser scribe apparatus 710 houses a femtosecond-based laser. The femtosecond-based laser is suitable for performing a laser ablation portion of a hybrid laser and etch singulation process, such as the laser ablation processes described above. In one embodiment, a moveable stage is also included in laser scribe apparatus 710, the moveable stage configured for moving a wafer or substrate (or a carrier thereof) relative to the femtosecond-based laser. In a specific embodiment, the femtosecond-based laser is also moveable. The overall footprint of the laser scribe apparatus 710 may be, in one embodiment, approximately 2240 millimeters by approximately 1270 millimeters, as depicted in FIG. 7.

In an embodiment, the one or more plasma etch chambers 708 is configured for etching a wafer or substrate through the gaps in a patterned mask to singulate a plurality of integrated circuits. In one such embodiment, the one or more plasma etch chambers 708 is configured to perform a deep silicon etch process. In a specific embodiment, the one or more plasma etch chambers 708 is an Applied Centura® Silvia™ Etch system, available from Applied Materials of Sunnyvale, Calif., USA. The etch chamber may be specifically designed for a deep silicon etch used to create singulated integrated circuits housed on or in single crystalline silicon substrates or wafers. In an embodiment, a high-density plasma source is included in the plasma etch chamber 708 to facilitate high silicon etch rates. In an embodiment, more than one etch chamber is included in the cluster tool 706 portion of process tool 700 to enable high manufacturing throughput of the singulation or dicing process.

The factory interface 702 may be a suitable atmospheric port to interface between an outside manufacturing facility with laser scribe apparatus 710 and cluster tool 706. The factory interface 702 may include robots with arms or blades for transferring wafers (or carriers thereof) from storage units (such as front opening unified pods) into either cluster tool 706 or laser scribe apparatus 710, or both.

Cluster tool 706 may include other chambers suitable for performing functions in a method of singulation. For example, in one embodiment, in place of an additional etch chamber, a deposition chamber 712 is included. The deposition chamber 712 may be configured for mask deposition on or above a device layer of a wafer or substrate prior to laser scribing of the wafer or substrate, e.g., by a uniform spin-on process. In one such embodiment, the deposition chamber 712 is suitable for depositing a uniform layer with a conformality factor within approximately 10%.

In embodiments, the isotropic plasma etch chamber 714 is employs a downstream plasma source, such as a high frequency magnetron or inductively coupled source disposed a distance upstream of a process chamber where a substrate is housed during isotropic etch processing described elsewhere herein. In embodiments the isotropic plasma etch chamber 714 is plumbed to use exemplary non-polymerizing plasma etch source gases, such as one or more of $NF_3$ or $SF_6$, $Cl_2$ or $SiF_4$, and one or more oxidizers, such as $O_2$.

Figure 8:
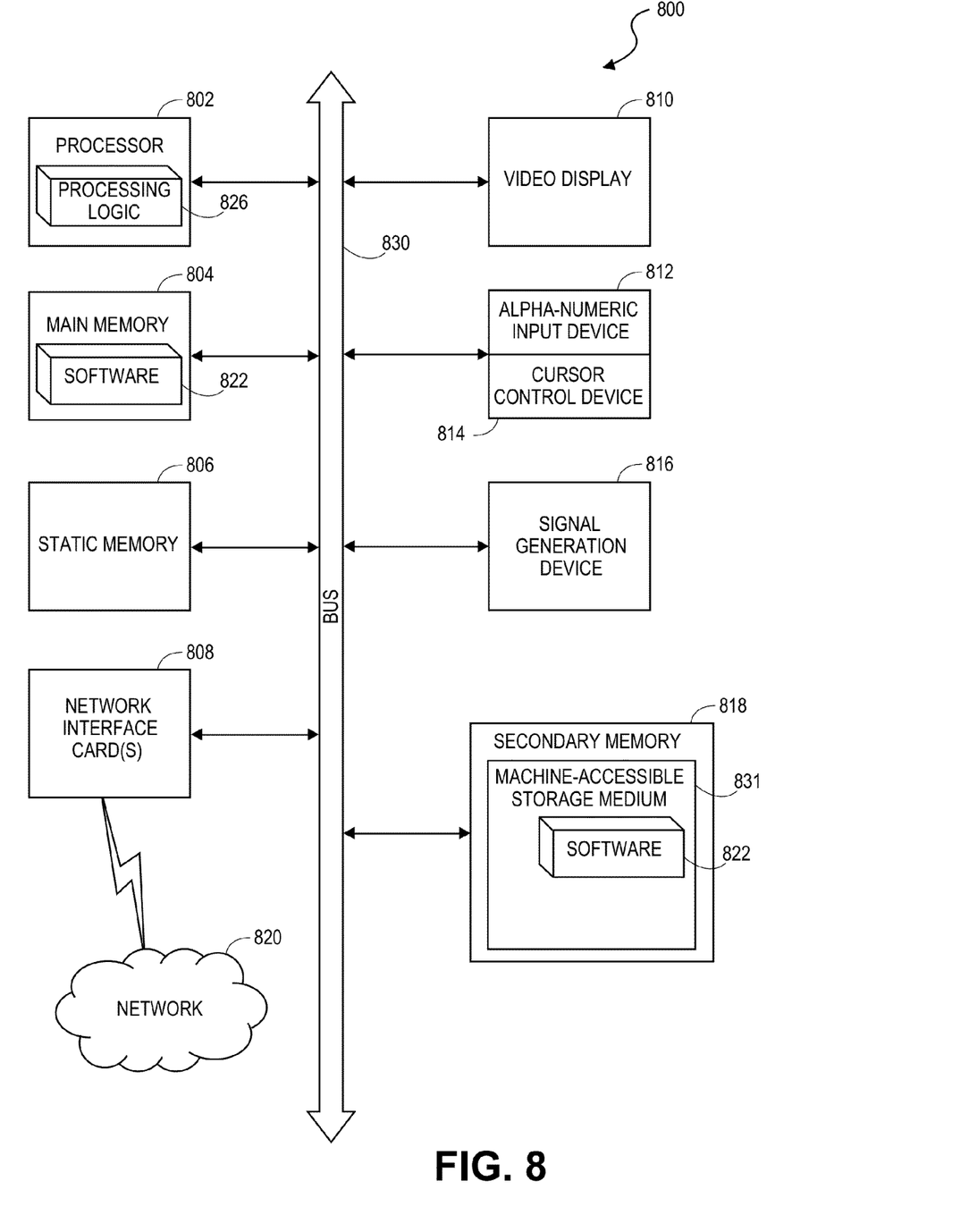
FIG. 8 illustrates a block diagram of an exemplary computer system which controls automated performance of one or more operation in the masking, laser scribing, plasma dicing methods described herein, in accordance with an embodiment of the present invention.

FIG. 8 illustrates a computer system 800 within which a set of instructions, for causing the machine to execute one or more of the scribing methods discussed herein may be executed. The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, etc. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a semiconductor wafer comprising a plurality of integrated circuits (ICs), the method comprising:
    forming a mask over the semiconductor wafer covering the plurality of ICs, the plurality of ICs including metal bumps or pads with an oxidation layer;
    patterning the mask with a laser scribing process to provide a patterned mask with gaps, removing non-silicon materials and exposing a silicon substrate of the semiconductor wafer between the ICs; and
    plasma etching the semiconductor wafer through the gaps in the patterned mask to singulate the plurality of ICs and remove the oxidation layer from the metal bumps or pads.

2. The method of claim 1, wherein forming the mask over the semiconductor wafer comprises depositing the mask with a thickness of 1-5 μm over the metal bumps or pads.

3. The method of claim 1, wherein the metal bumps or pads comprise a tin alloy.

4. The method of claim 1, further comprising:
- aligning the singulated ICs with a second plurality of ICs comprising second metal bumps or pads; and
- applying pressure to bond the metal bumps or pads with the second metal bumps or pads without flux.

5. The method of claim 1, wherein the semiconductor wafer has a diameter of at least 300 mm and a thickness of 75 µm or less.

6. The method of claim 1, wherein patterning the mask further comprises direct writing a pattern with a femtosecond laser having a wavelength less than or equal to 540 nanometers and a laser pulse width less than or equal to 500 femtoseconds.

7. The method of claim 6, wherein plasma etching the semiconductor wafer through the gaps in the patterned mask to singulate the plurality of ICs and remove the oxidation layer from the metal bumps or pads comprises iterations of:
- anisotropically etching the semiconductor wafer through the gaps in the patterned mask;
- isotropically etching the anisotropically etched trench; and
- polymer deposition on a surface of the semiconductor wafer and newly formed surfaces due to anisotropic and isotropic etching.

8. The method of claim 1, wherein forming the mask further comprises depositing a water-soluble mask layer on the semiconductor wafer.

9. The method of claim 8, wherein forming the mask further comprises depositing a multi-layered mask comprising the water-soluble mask layer as a base coat and a non-water-soluble mask layer as an overcoat on top of the base coat.

10. A method of dicing a substrate comprising a plurality of integrated circuits (ICs), the method comprising:
- patterning, with a laser scribe process, a mask disposed above the substrate to form a trench exposing regions of the substrate between the ICs, wherein the mask is thicker over a dicing street than over metal bumps or pads of the plurality of ICs; and
- plasma etching the substrate in the exposed regions to singulate the plurality of ICs and remove an oxidation layer from the metal bumps or pads.

11. The method of claim 10, further comprising:
- forming the mask having a thickness of 1-5 µm over the metal bumps or pads.

12. The method of claim 10, wherein the metal bumps or pads comprise a tin alloy.

13. The method of claim 10, further comprising:
- aligning the singulated ICs with a second plurality of ICs comprising second metal bumps or pads; and
- applying pressure to bond the metal bumps or pads with the second metal bumps or pads without flux.

14. The method of claim 13, wherein plasma etching the substrate in the exposed regions to singulate the plurality of ICs and remove the oxidation layer from the metal bumps or pads comprises:
- anisotropically etching the trench in the substrate, wherein anisotropic etching comprises polymer deposition and directional bombardment etch; and
- isotropically etching the anisotropically etched trench.

15. The method of claim 10, further comprising:
- depositing a water-soluble mask layer over the substrate, forming the mask.

16. The method of claim 15, wherein forming the mask further comprises depositing a multi-layered mask comprising the water-soluble mask layer as a base coat and a non-water-soluble mask layer as an overcoat on top of the base coat.

17. A system for dicing a substrate comprising a plurality of integrated circuits (ICs), the system comprising:
- a deposition module to apply a mask over the substrate covering the plurality of ICs, the plurality of ICs having metal bumps or pads with an oxidation layer;
- a laser scribe module to pattern the mask to form a trench exposing regions of the substrate between the ICs; and
- a plasma etch module physically coupled to the laser scribe module to etch the substrate in the exposed regions to singulate the plurality of ICs and remove the oxidation layer from the metal bumps or pads.

18. The system of claim 17, wherein the deposition module to apply the mask is to apply the mask having a thickness of 1-5 µm over the metal bumps or pads, and a second thickness over a dicing street which is greater than the thickness over the metal bumps or pads.

19. The system of claim 17, wherein the laser scribe module comprises a femtosecond laser having a wavelength less than or equal to 540 nanometers and a pulse width of less than or equal to 500 femtoseconds.

20. The system claim 17, wherein the plasma etch module is to perform iterations of:
- anisotropically etching the substrate in the exposed regions;
- isotropically etching the anisotropically etched trench; and
- polymer deposition on a surface of the substrate and newly formed surfaces due to anisotropic and isotropic etching.

* * * * *